(12) United States Patent
Liu et al.

(10) Patent No.: US 8,370,699 B2
(45) Date of Patent: Feb. 5, 2013

(54) SEMICONDUCTOR MEMORY APPARATUS FOR REDUCING BUS TRAFFIC BETWEEN NAND FLASH MEMORY DEVICE AND CONTROLLER

(75) Inventors: Wei Liu, Yongin-si (KR); Jeong-woo Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 994 days.

(21) Appl. No.: 12/382,466

(22) Filed: Mar. 17, 2009

(65) Prior Publication Data

US 2009/0249138 A1    Oct. 1, 2009

(30) Foreign Application Priority Data

Mar. 25, 2008 (KR) .................. 10-2008-0027364

(51) Int. Cl.
*G06F 11/00* (2006.01)
(52) U.S. Cl. ....................................... 714/752
(58) Field of Classification Search .................. 714/752
See application file for complete search history.

(56) References Cited

U.S. PATENT DOCUMENTS

2008/0244362 A1    10/2008 Liu et al.

FOREIGN PATENT DOCUMENTS

| JP | 11-073797 | 3/1999 |
|----|-----------|--------|
| KR | 10-0391240 | 7/2003 |
| KR | 10-2007-0109686 | 11/2007 |
| KR | 2008-0088989 | 10/2008 |

OTHER PUBLICATIONS

Abstract of Korean Publication No. 10-2001-37139, published Jul. 12, 2001.

*Primary Examiner* — Bryce Bonzo
(74) *Attorney, Agent, or Firm* — Harness, Dickey & Pierce, P.L.C.

(57) ABSTRACT

Provided is a semiconductor memory apparatus that may use an efficient protocol between an NAND flash memory device and a controller to reduce bus traffic. The flash memory device may include a memory cell array and an error correction encoder. The memory cell array may include a plurality of pages. The error correction encoder may generate first parity data based on normal data to be written to the memory cell array, compare the first parity data and second parity data encoded with the normal data stored in the memory cell array, and check an error. The error position detector may detect an error position in response to the error signal transmitted from the error correction encoder. Thus, since the semiconductor memory apparatus may transmit and receives parity data or a syndrome between an NAND flash memory device and the controller by detecting and correcting an error in the same memory chip, bus traffic may be reduced.

20 Claims, 7 Drawing Sheets

SEMICONDUCTOR MEMORY APPARATUS FOR REDUCING BUS TRAFFIC BETWEEN NAND FLASH MEMORY DEVICE AND CONTROLLER

FOREIGN PRIORITY STATEMENT

This application claims priority under 35 U.S.C. §119 to Korean Patent Application No. 10-2008-0027364, filed on Mar. 25, 2008 in the Korean Intellectual Property Office (KIPO), the entire contents of which are incorporated herein by reference.

BACKGROUND

Example embodiments relate to a semiconductor memory apparatus, and more particularly, to a semiconductor memory apparatus using a protocol between an NAND flash memory device and a controller, which may efficiently correct a plurality of error bits existing in a single section while reducing bus traffic in a multi-level cell flash memory device supporting internal copy-back.

As flash memory devices have increased in capacity, a flash memory device may include a plurality of chips CIP1 through CIPn connected to a single bus BUS, as illustrated in FIG. 1. The chips CIP1 through CIPn may share a controller CTRL connected to the bus BUS. In order to reduce bus traffic, such a multi-chip type flash memory device may support internal copy-back.

Internal copy-back is a protocol in which an external input/output (I/O) bus may not be required since a page buffer P_BUF inside a chip may be used when a page PAGEi is copied on another page PAGEj, as illustrated in FIG. 2.

However, the conventional flash memory device may detect and correct an error by using an error correcting circuit, which may be included in a controller CTRL as is illustrated in FIG. 1, included outside of a chip. A conventional method of detecting and correcting an error will be described in detail.

FIG. 3 is a block diagram of a conventional semiconductor chip 100 having an error correcting circuit and a flash memory device.

Referring to FIG. 3, the semiconductor chip 100 may include a flash memory cell array 120 and an error correcting circuit 140. The semiconductor chip 100 may be connected to an external circuit (not shown) via a bus 200. The error correcting circuit 140 may include a NAND interface 141, an error correction encoding circuit 142, and an error correction decoding circuit 143.

The error correction encoding circuit 142 may receive normal data NDTA that is to be stored in the flash memory cell array 120, and may generate corresponding parity data PDTA. The normal data NDTA and the parity data PDTA may be respectively stored in a normal data region (not shown) and a parity data region (not shown) of the flash memory cell array 120.

The error correction decoding circuit 143 may detect and correct an error in the normal data NDTA when reading the normal data NDTA from the memory cell array 120.

In this case, error correction may be performed using the BCH (Bose-Chaudhuri-Hocquenghem) error correction algorithm. The BCH error correction algorithm may be capable of correcting multiple bits of error in a data block, and thus has been widely applied to error correction in communication systems and memory systems.

In particular, in the case of a multi-level cell flash memory device that stores multiple bits in a cell, bit errors may be very likely to occur. Thus, error correction is preferably performed using the BCH error correction algorithm capable of correcting multiple bits of error.

Error correction using the BCH algorithm, and particularly, error correction using binary BCH 4148, 4096 code data (hereinafter referred to as "BCH code data") will be described in detail. However, example embodiments are not limited to the size of binary BCH code data that will be described.

In general, in error correction using the BCH algorithm, BCH code data may be generated using an error correcting encoder, and decoded using an error correcting decoder. Specifically, the BCH code data may be decoded by calculating syndromes, constructing an error locator polynomial using the syndromes, and calculating the locations of error bits by obtaining the root of the error locator polynomial. In particular, in order to decode binary BCH code data, an error may be corrected by inverting the bit value of an error bit.

FIG. 4 is a conceptual diagram illustrating the format of BCH code data CDATA.

Referring to FIG. 4, the BCH code data CDTA may consist of 512-byte normal data NDTA and 7-byte parity data PDTA. The parity data PDTA may consist of 48-bit parity data and 4-bit dummy data.

FIG. 5 is a diagram illustrating the format of a plurality of pieces of normal data NDTA and a plurality of pieces of parity data PDTA that are stored within one page of a NAND flash memory device.

In particular, FIG. 5 illustrates a page PAGEn with a 2K byte normal data region NStorage and 64 byte parity data region PStorage. Accordingly, four pieces of 512-byte normal data NDTA1 through NDTA4 and four pieces of parity data P1 through P4 that may respectively correspond to the normal data NDTA1 through NDTA4, are stored in the page PAGEn.

Likewise, since the conventional flash memory device may need to transmit and receive normal data and parity data to and from the memory cell array and the error correcting circuit via a bus in order to detect and correct an error, bus traffic might occur. Thus, internal copy-back in the conventional flash memory device may not be efficient.

SUMMARY

Example embodiments provide a semiconductor memory apparatus using a protocol between a NAND flash memory device and a controller, which may reduce bus traffic when detecting and correcting an error.

According to an aspect of example embodiments, there is provided a semiconductor memory apparatus comprising a flash memory device and a controller.

The flash memory device may include a memory cell array and an error correction encoder. An error correction encoder may generate first parity data based on normal data to be written to the memory cell array, may compare the first parity data and second parity data encoded with the normal data stored in the memory cell array, and may output an error signal when an error exists.

The controller may comprise an error position detector detecting an error position in response to the error signal transmitted from the error correction encoder.

The semiconductor memory apparatus may comprise a plurality of flash memory devices, wherein the plurality of flash memory devices and the controller may be connected via a bus.

The error correction encoder may detect whether the error exists in response to an internal copy-back command. The error correction encoder may detect whether the error exists in response to a read command.

The error correction encoder may comprise an encoding unit generating the first parity data and the second parity data; a comparing unit comparing the first parity data and the second parity data; and a checking unit outputting the error signal when the first parity data and the second parity data are different.

The error position detector may comprise: a syndrome generating unit generating a syndrome in response to the error signal; and an error position searcher calculating an error position by using the syndrome. The syndrome generating unit may generate a plurality of syndromes with respect to a plurality of bits in parallel.

The error position searcher may comprise a Berlekamp-Massey operator and a Chien searcher, calculating the error position by respectively using a Berlekamp-Massey algorithm and a Chien search algorithm. The Chien searcher may perform the Chien search algorithm with respect to a plurality of bits in parallel.

The flash memory device may further comprise an error corrector receiving the error position from the error position detector, and correcting the error by reversing a bit value of a pertaining bit.

The flash memory device may be an NAND flash memory device.

The flash memory device may be a multi level-cell flash memory.

The flash memory device may transmit the error signal to the controller on a sector-by-sector basis or on a page-by-page basis.

According to another aspect of example embodiments, there is provided a semiconductor memory apparatus comprising a flash memory device and a controller, the flash memory device comprising a memory cell array, an error correction encoder and a syndrome generator.

The memory cell array may include a plurality of data pages. The error correction encoder may generate first parity data by normal data to be written to the memory cell array, may compare the first parity data and second parity data encoded with the normal data stored in the memory cell array, and may check an error. The syndrome generator may generate a syndrome when the first parity data and the second parity data are different.

The controller may comprise an error position detector detecting an error position by using a syndrome transmitted from the syndrome generator.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
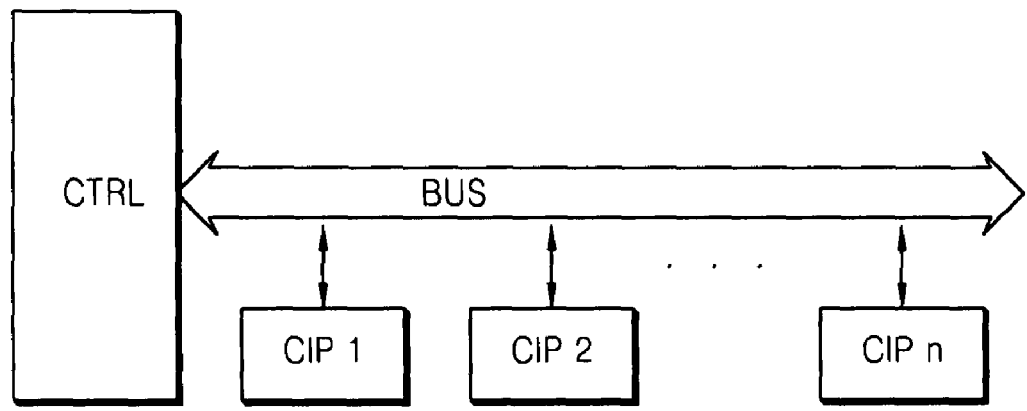
FIG. 1 illustrates a semiconductor memory apparatus including a plurality of chips.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 6:
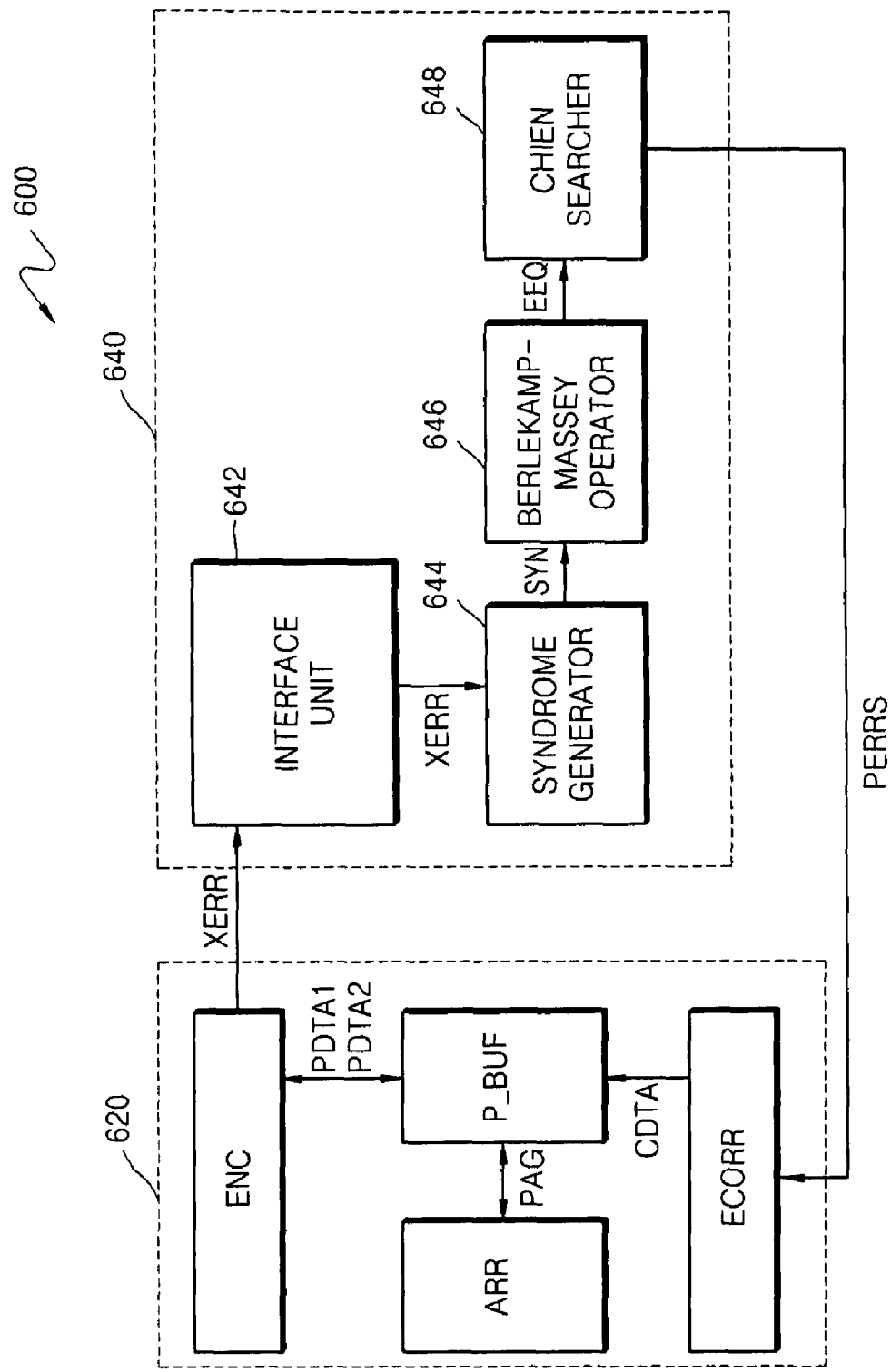
FIG. 6 illustrates a semiconductor memory apparatus according to an embodiment of example embodiments.
Figure 7:
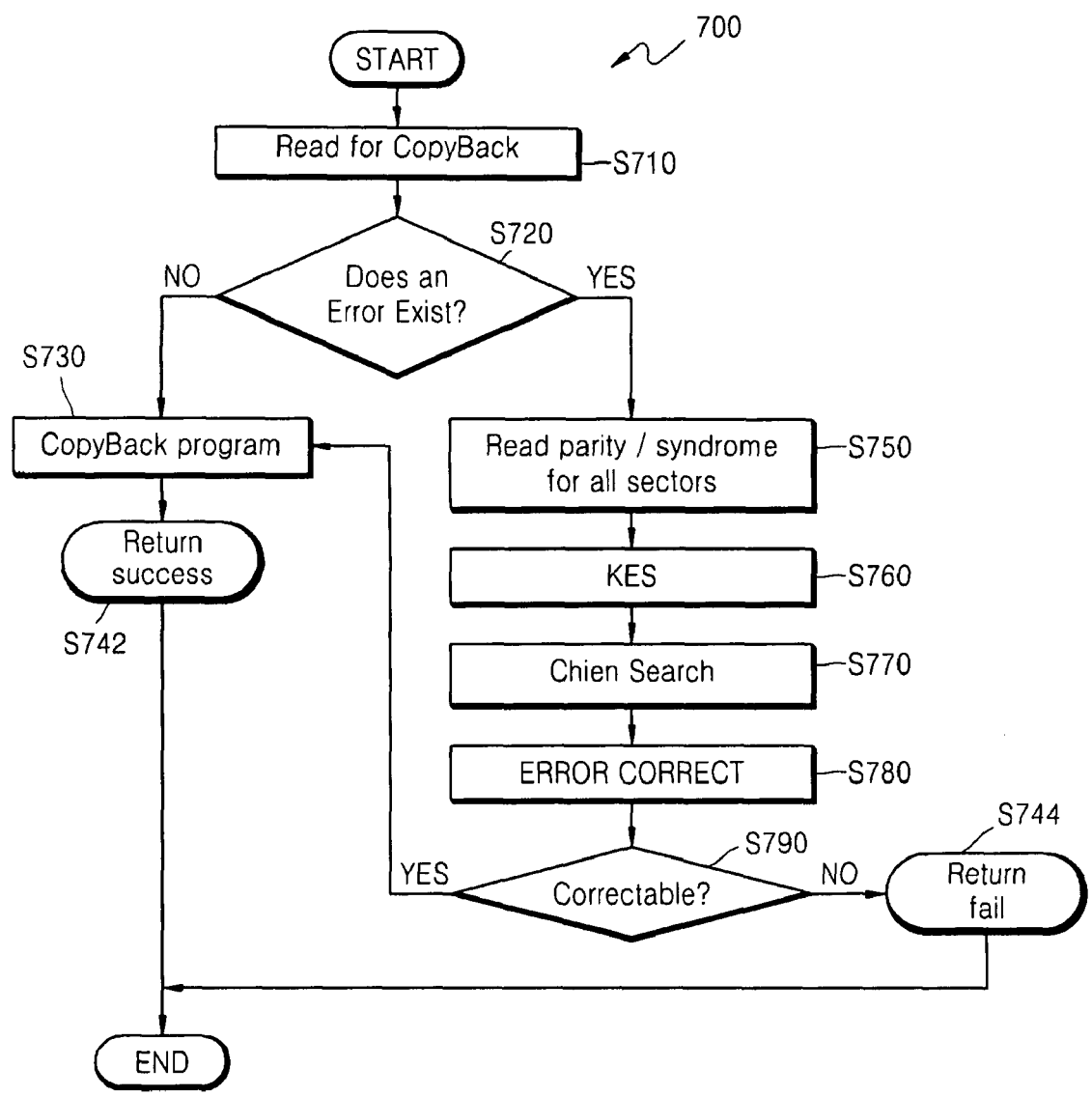
FIGS. 7 and 9 are flowcharts illustrating an error correction method of the semiconductor memory apparatus of FIG. 6, according to embodiments of example embodiments.

FIG. 6 illustrates a semiconductor memory apparatus 600 according to example embodiments. FIG. 7 is a flow chart of an error correction method 700 of the semiconductor memory apparatus 600 of FIG. 6, according to example embodiments.

Referring to FIGS. 6 and 7, the semiconductor memory apparatus 600 may include a flash memory device 620 and a controller 640.

The flash memory device 620 may include a memory cell array ARR, an error correction encoder ENC, a page bugger P_BUF, and an error corrector ECORR. The flash memory device 620 may be a NAND flash memory device. In addition, the flash memory device 620 may be a multilevel-cell flash memory device.

The controller 640 may include an interface unit 642, a syndrome generator 644, a Berlekamp-Massey operator 646, and a Chien searcher 648.

According to example embodiments, the semiconductor memory apparatus 600 may include a plurality of chips CIP1 through CIPn, which may each include the flash memory device 620. According to example embodiments, chips CIP1 through CIPn may be connected to the controller 640 and a bus, which may be common to the chips CIP1 through CIPn. For example, the chips CIP1 through CIPn which include the flash memory device 620, and controller 640 may be connected via a bus in the same manner as chips CIP1 through CIPn, and controller CTRL depicted in FIG. 1, respectively.

Figure 4:
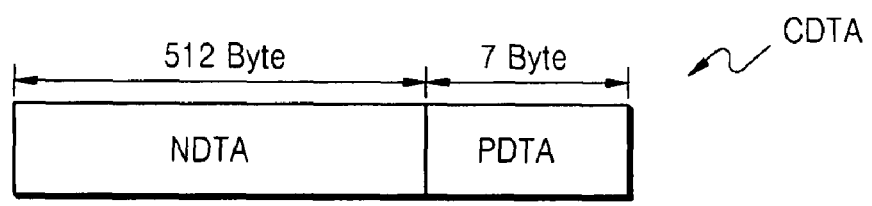
FIG. 4 is a conceptual diagram illustrating the format of BCH (Bose-Chaudhuri-Hocquenghem) code data CDATA.
Figure 5:
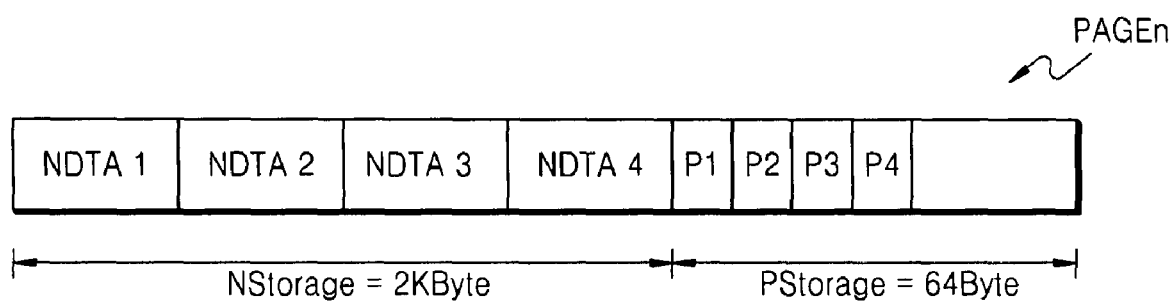
FIG. 5 is a diagram illustrating the format of a plurality of pieces of normal data and a plurality of pieces of parity data that are stored within one data page of a NAND flash memory device.

The error correction encoder ENC may compare a first parity data PDATA1 and a second parity data PDATA2, and may check an error (operation S720). According to example embodiments, the first parity data PDATA1 may be the same data as the parity data PDTA illustrated in FIG. 4, which may be generated by encoding normal data NDTA to be written to the memory cell array ARR. In addition, the second parity data PDATA2 may be parity data generated by encoding the normal data NDTA written in the memory cell array ARR. The memory cell array ARR may include a plurality of data pages. According to example embodiments, the flash memory device 620 may move a page PAG to be written or read from the memory cell array ARR to the page buffer P_BUF, and may then perform a write or read operation.

When the first parity data PDATA1 and the second parity data PDATA2 are not the same ("YES" in operation S720), the error correction encoder ENC may output an error signal XERR. At this time, the error signal XERR may be XOR between the first parity data PDATA1 and the second parity data PDATA2.

On the other hand, when the first parity data PDATA1 and the second parity data PDATA2 are the same ("NO" in operation S720), the semiconductor memory apparatus 600 may perform an operation corresponding to an input instruction (operation S730), and may output a message "Return Success" (operation S742).

Figure 2:
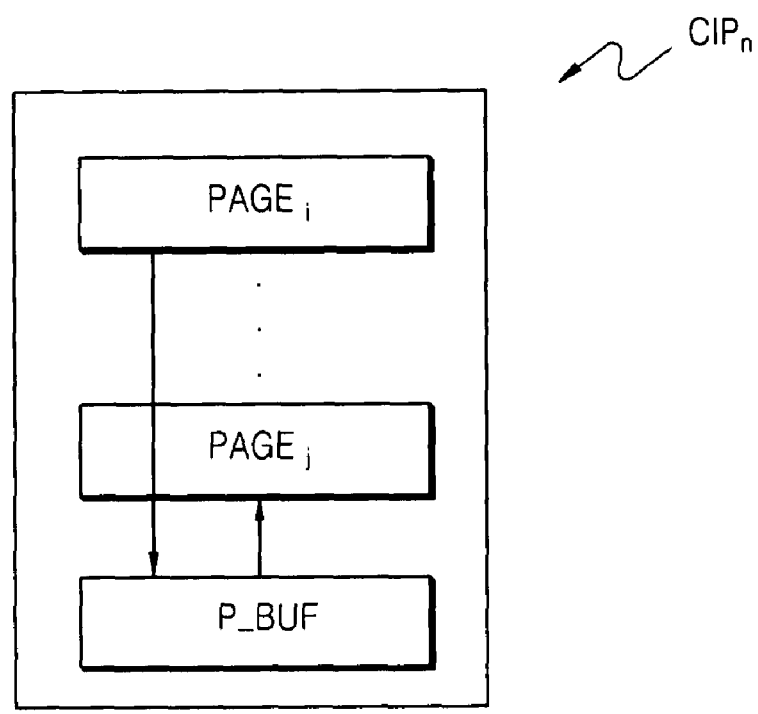
FIG. 2 illustrates an internal copy-back protocol in a flash memory device included in a chip of FIG. 1.
Figure 3:
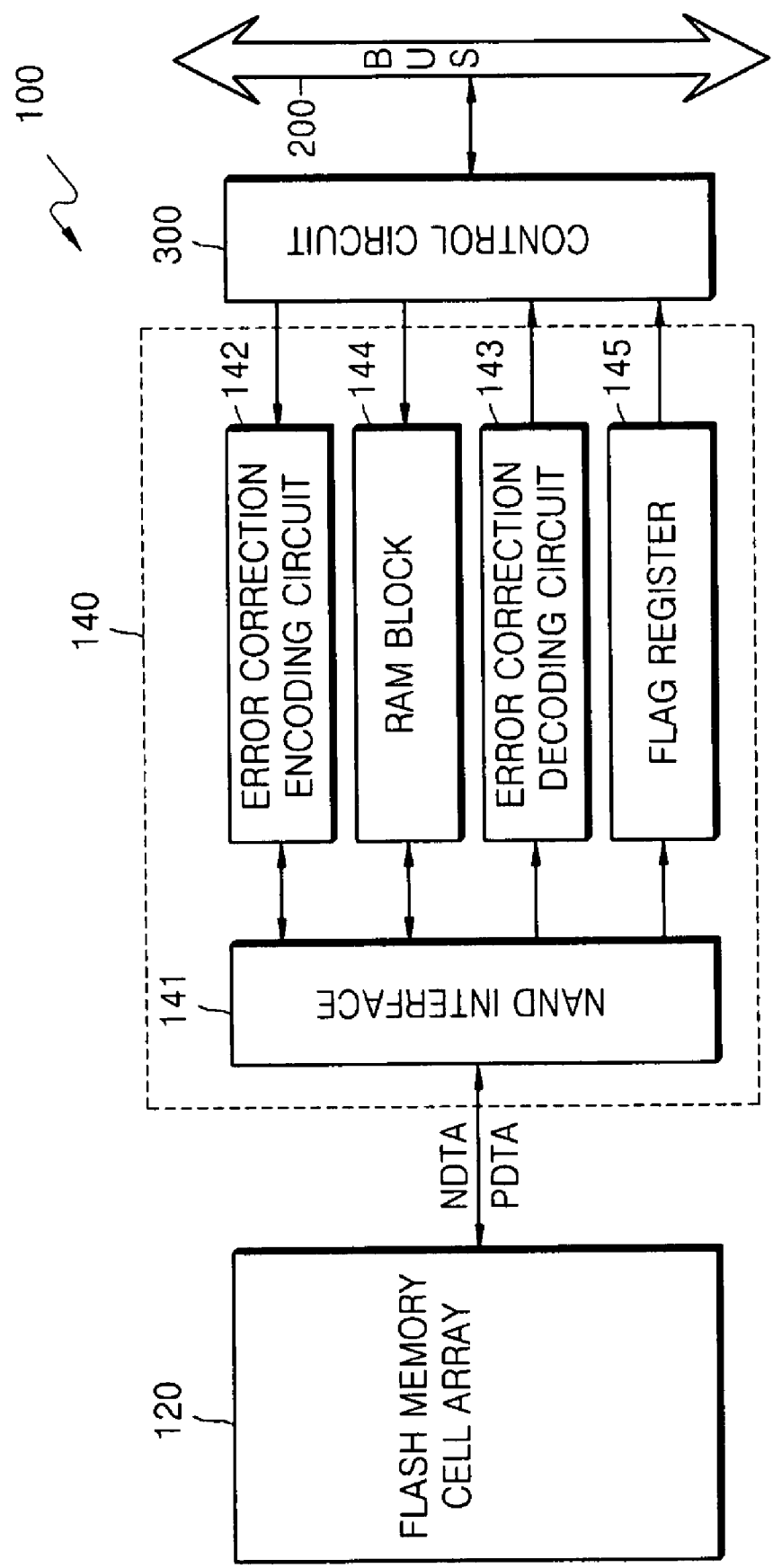
FIG. 3 is a block diagram of a conventional semiconductor chip having an error correcting circuit and a flash memory device.

In FIG. 7 an internal copy-back demand may be input (i.e., an internal copy-back program may be performed). The error correction encoder ENC may check an error in response to the internal copy-back (operation S710). The semiconductor memory apparatus 600 may store a page pertaining to the internal copy-back in a page buffer and may detect an error regarding the page stored in the page buffer, in response to the internal copy-back, as illustrated in FIG. 2.

Alternatively, the error correction encoder ENC may check an error in response to a demand for a read operation. According to example embodiments, the semiconductor memory apparatus 600 of FIG. 6 may detect and correct an error using the method illustrated FIG. 7. When an error does not exist or is corrected, the semiconductor memory apparatus 600 may perform a read operation. Furthermore, the semiconductor memory apparatus 600 may apply a separate instruction for checking an error.

Accordingly, since a flash memory device according to example embodiments may itself detect an error, a problem with bus traffic for transmitting and receiving parity data may be overcome.

Referring to FIGS. 6 and 7, the controller 640 may detect an error position PERRS in response to the error signal XERR. The error signal XERR may be received by an interface unit 642 and transmitted to a syndrome generator 644. The syndrome generator 644 may generate a syndrome SYN in response to an error signal (operation S750).

The syndrome SYN may be transmitted to a Berlekamp-Massey operator 646. The Berlekamp-Massey operator 646 may calculate an error position equation EEQ by using a Berlekamp-Massey algorithm (operation S760). Then, a Chien searcher 648 may search for an error position PERRS (operation S770). The error position PERRS may be searched for using the Chien search algorithm. The Chien search algorithm may be used to search for the error position PERRS according whether the error position equation is "0".

According to example embodiments, the syndrome generator 644 may generate a plurality of syndromes with respect to a plurality of bits in parallel. In addition, the Chien searcher 648 may operate the Chien search algorithm with respect to a plurality of bits in parallel.

Thus, although a flash memory device according to example embodiments may check an error on a bit-by-bit basis by employing an EDC (error detection and correction) error correction scheme, the flash memory device may simultaneously detect and correct an error position. According to example embodiments, with a multi-level cell scheme or high-integration, the flash memory device in which a plurality of bits may be generated in a signal section may effectively correct an error.

Operations of the syndrome generator 644, the Berlekamp-Massey operator 646 and the Chien searcher 648 of the semiconductor memory apparatus 600 are disclosed in Korean Patent Application No. 10-2007-0031929. Accordingly, detailed descriptions thereof will be omitted here.

Referring to FIG. 6, the error corrector ECORR included in the flash memory device 620 may receive the error position PERRS, and may correct an error by reversing a bit value of a pertaining bit (operation S780).

When the error is corrected ("YES" of operation S790), the semiconductor memory apparatus 600 may perform an operation pertaining to an input demand for an internal copy-back program (operation S730), and output a message "Return Success" (operation S742). On the other hand, when the error is not corrected ("NO" of operation S790), the semiconductor memory apparatus 600 may output a message "Return Fail" (operation S744).

In the case of FIG. 7 described above, in particular, the error correction encoder ENC may detect an error on a page-by-page basis and may transmit the error to a controller. When an error is detected on a page-by-page basis, as illustrated in FIG. 7, a control operation may be easy.

Figure 9:
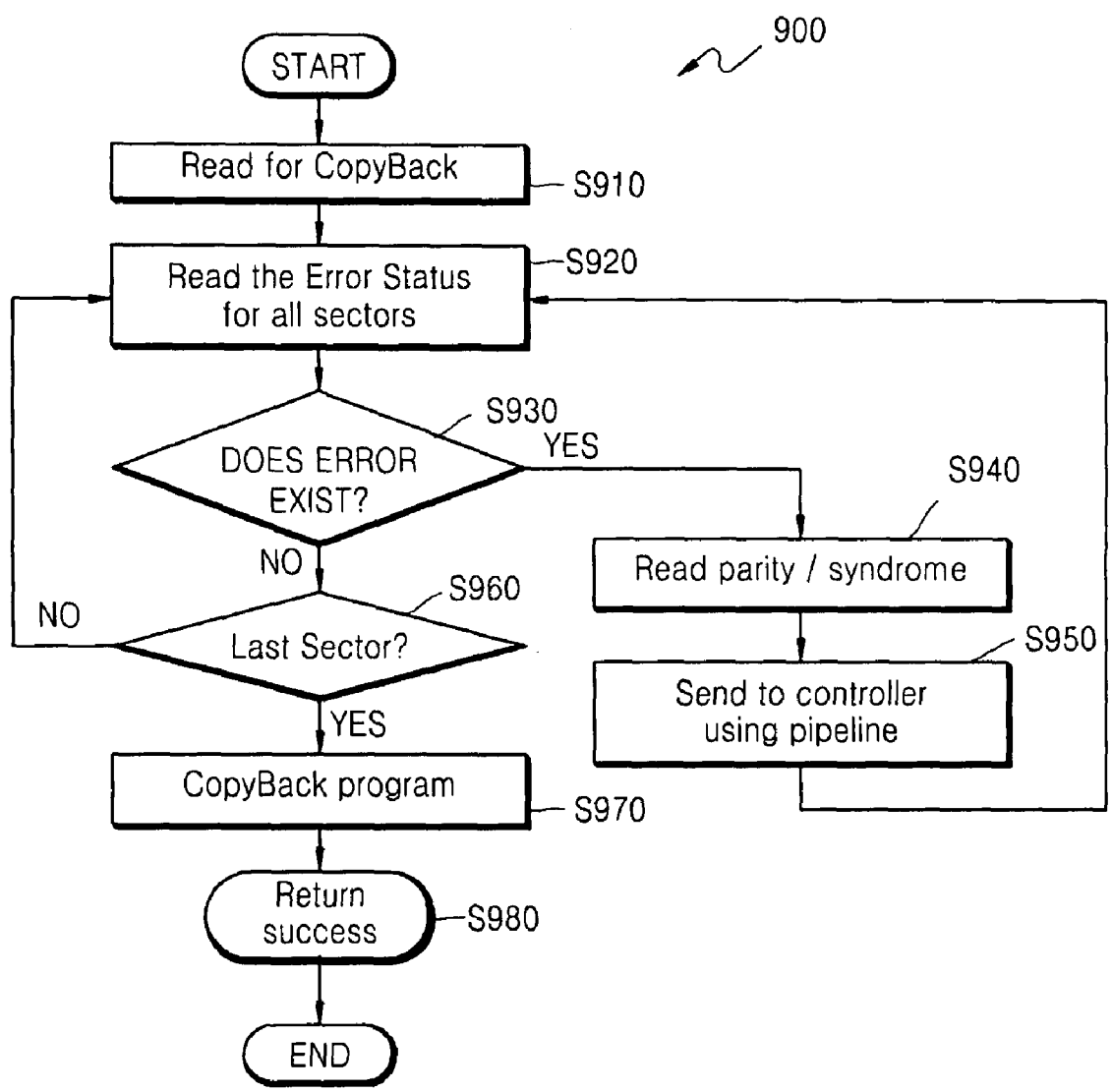

However, according to another embodiment of example embodiments, as illustrated in FIG. 9, an error may be detected on a sector-by-sector basis, and an error may be transmitted to a controller. In the present embodiment of FIG. 9, whether an error exists is determined on a sector-by-sector basis (operations S920 and S930). When the error does not exist in a pertaining sector ("NO" of operation S930), an operation of determining whether an error of a next sector exists is performed until all sectors have been checked (operation S960).

When an error does not exist in any sectors and the last sector has been checked ("YES" of operation S960), a flash memory device may perform an operation pertaining to an input demand for an internal copy-back program(operation S970), like in the case of FIG. 7, and may output a message "Return Success" (operation S980).

On the other hand, when an error does not exist in a pertaining sector ("YES" of operation S930), the flash memory device may generate an error signal regarding the pertaining sector (operation S940), like in the case of FIG. 7, and may transmit the error signal to a controller (operation S950). According to example embodiments, the error signal may be transmitted to the controller by using a pipe line structure. Thus, as illustrated in FIG. 9, when an error is detected on a sector-by-sector basis, a sector pipe line (not shown) that is basically included in a flash memory device is used, thereby improving an error detecting speed.

Figure 8:
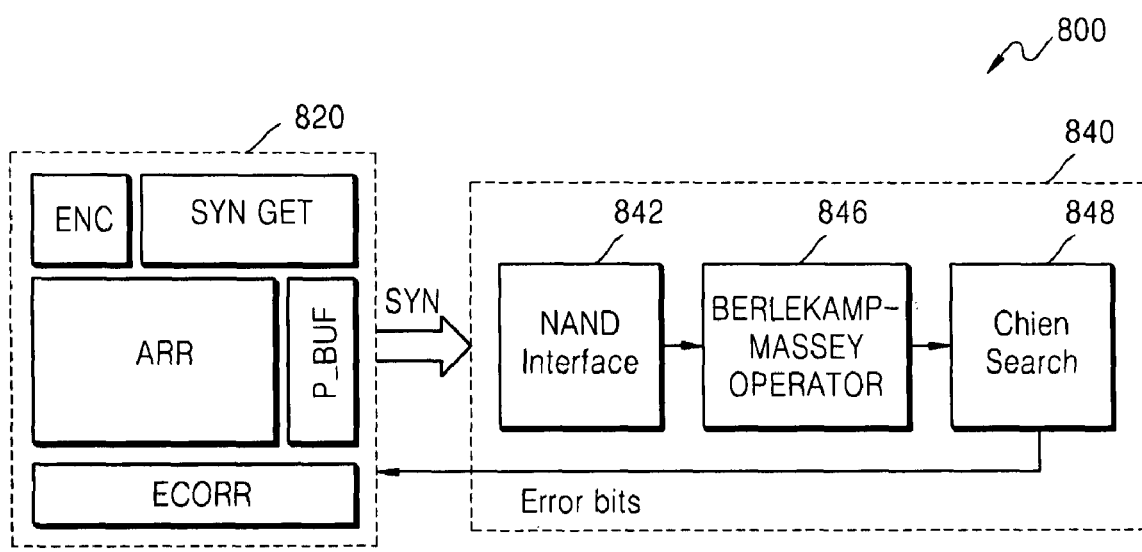
FIG. 8 illustrates a semiconductor memory apparatus according to another embodiment of example embodiments.

FIG. 8 illustrates a semiconductor memory apparatus 800 according to example embodiments.

Referring to FIG. 8, the semiconductor memory apparatus 800 of FIG. 8 may include a flash memory device 820 and a controller 840.

The flash memory device 820 may be arranged in a manner substantially similar to that of flash memory device 620 in semiconductor memory apparatus 600 illustrated in FIG. 6 with the exception that the flash memory device 820 in semiconductor memory apparatus 800 may further include a syndrome generator SYN GET.

The controller 840 may include a NAND interface 842, a Berlekamp-Massey operator 846, and a Chien searcher 848, which may operate in a manner substantially similar to that of interface unit 642, a Berlekamp-Massey operator 646, and a Chien searcher 648 in semiconductor memory apparatus 600 of FIG. 6, respectively.

Accordingly, flash memory device 820 may include both the error correction encoder ENC and a syndrome generator SYN GET. Thus, because the flash memory device 820 may transmit and receive only a syndrome SYN and an error position PERRS via a bus to controller 840, bus traffic may be reduced.

Since the semiconductor memory apparatus 800 may detect and correct an error in a manner substantially similar to that of the semiconductor memory apparatus 600 of FIG. 6, descriptions thereof will be omitted here. For example, in the semiconductor memory apparatus 800, an internal copy-back demand may also be received, and an error may be checked and corrected in response to a read demand. In addition, the semiconductor memory apparatus 800 may check an error on a sector-by-sector basis or on a page-by-page basis.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor memory apparatus comprising: one or more flash memory devices, the one or more flash memory devices including
   a memory cell array including a plurality of pages, and
   an error correction encoder configured to generate first parity data based on normal data to be written to the memory cell array, to compare the first parity data and second parity data encoded with the normal data stored in the memory cell array to detect whether an error exists, and to generate an error signal based on a result of the comparing; and
   a controller located on the outside of the one or more flash memory devices, the controller including an error position detector configured to detect an error position based on the error signal transmitted from the one or more flash memory devices through a bus connected between the one or more flash memory devices and the controller.

2. The semiconductor memory apparatus of claim 1, wherein the error correction encoder is configured to output the error signal if an error exists, and the error position detector is configured to detect the error position in response to the output error signal.

3. The semiconductor memory apparatus of claim 2, wherein the one or more flash memory devices is a plurality of flash memory devices, and
   the plurality of flash memory devices are connected to the controller via a bus.

4. The semiconductor memory apparatus of claim 2, wherein the error correction encoder is configured to detect whether the error exists in response to an internal copy-back command.

5. The semiconductor memory apparatus of claim 2, wherein the error correction encoder is configured to detect whether the error exists in response to a read command.

6. The semiconductor memory apparatus of claim 2, wherein the error correction encoder includes
   an encoding unit configured to generate the first parity data and the second parity data;
   a comparing unit configured to compare the first parity data and the second parity data; and
   a checking unit configured to output the error signal if the first parity data and the second parity data are different.

7. The semiconductor memory apparatus of claim 2, wherein the error position detector includes
   a syndrome generating unit configured to generate a syndrome in response to the error signal; and
   an error position searcher configured to calculate an error position by using the syndrome.

8. The semiconductor memory apparatus of claim 7, wherein the syndrome generating unit is configured to generate a plurality of syndromes with respect to a plurality of bits in parallel.

9. The semiconductor memory apparatus of claim 7, wherein the error position searcher includes a Berlekamp-Massey operator and a Chien searcher, the Berlekamp-Massey operator and a Chien searcher being configured to calculate the error position by respectively using a Berlekamp-Massey algorithm and a Chien search algorithm.

10. The semiconductor memory apparatus of claim 9, wherein the Chien searcher is configured to perform the Chien search algorithm with respect to a plurality of bits in parallel.

11. The semiconductor memory apparatus of claim 2, wherein the flash memory device further includes an error corrector configured to receive the error position from the error position detector, and correct the error by reversing a bit value of a pertaining bit.

12. The semiconductor memory apparatus of claim 2, wherein the flash memory device is configured to transmit the error signal to the controller on a sector-by-sector basis or on a page-by-page basis.

13. Error correcting method of a semiconductor memory apparatus including a flash memory device and a memory controller, comprising:

generating first parity data based on normal data to be written to a memory cell array of the flash memory;

comparing the first parity data and second parity data encoded with the normal data stored in the memory cell array to detect whether an error exists;

generating an error signal based on a result of the comparing;

outputting the error signal through a bus connected between the flash memory device and the controller, the controller being located outside the flash memory device; and detecting an error position in based on the error signal by the controller, wherein the comparing the first parity data and second parity data and the outputting the error signal are operated by an error correction encoder of the flash memory in response to an internal copy-back command.

14. The semiconductor memory apparatus of claim 1, wherein the flash memory device further includes a syndrome generator configured to generate a syndrome if the first parity data and the second parity data are different, the error signal is the generated syndrome, and the error position detector is configured to detect an error position by using the generated syndrome.

15. The semiconductor memory apparatus of claim 14, wherein the error correction encoder is configured to detect whether the error exists in response to an internal copy-back command.

16. The semiconductor memory apparatus of claim 14, wherein the error correction encoder is configured to detect whether the error exists in response to a read command.

17. The semiconductor memory apparatus of claim 14, wherein the error position searcher includes a Berlekamp-Massey operator and a Chien searcher, Berlekamp-Massey operator and a Chien searcher being configured to calculate an error position by respectively using a Berlekamp-Massey algorithm and a Chien search algorithm.

18. The semiconductor memory apparatus of claim 17, wherein the Chien searcher is configured to perform the Chien search algorithm with respect to a plurality of bits in parallel.

19. The semiconductor memory apparatus of claim 14, wherein the flash memory device further includes an error corrector configured to receive the error position from the error position detector, and correct the error by reversing a bit value of a pertaining bit.

20. The semiconductor memory apparatus of claim 14, wherein the flash memory device is configured to transmit the error signal to the controller on a sector-by-sector basis or on a page-by-page basis.

* * * * *